United States Patent
Carter

(10) Patent No.: US 6,919,780 B2
(45) Date of Patent: Jul. 19, 2005

(54) ELECTROMAGNETIC INTERFERENCE FILTER

(75) Inventor: Mark A. Carter, Casselberry, FL (US)

(73) Assignee: Dearborn Electronics, Inc., Longwood, FL (US)

(*) Notice: Subject to any disclaimer, the term of this patent is extended or adjusted under 35 U.S.C. 154(b) by 144 days.

(21) Appl. No.: 10/636,092

(22) Filed: Aug. 7, 2003

(65) Prior Publication Data

US 2004/0027215 A1 Feb. 12, 2004

Related U.S. Application Data

(60) Provisional application No. 60/401,855, filed on Aug. 7, 2002.

(51) Int. Cl.$^7$ .............................. H03H 7/01; H01G 4/35
(52) U.S. Cl. ........................ 333/182; 333/185; 361/302
(58) Field of Search ................................ 333/181, 182, 333/183, 184, 185; 361/302

(56) References Cited

U.S. PATENT DOCUMENTS

| | | | | |
|---|---|---|---|---|
| 3,249,834 A | * | 5/1966 | Schlicke et al. | ............. 361/302 |
| 3,546,638 A | * | 12/1970 | Park | ........................... 333/182 |
| 3,548,347 A | * | 12/1970 | Miller et al. | ................. 333/182 |
| 3,753,168 A | * | 8/1973 | Schor | .......................... 333/185 |
| 4,148,003 A | * | 4/1979 | Colburn et al. | .............. 333/181 |
| 4,424,551 A | * | 1/1984 | Stevenson et al. | ........... 361/302 |
| 4,464,702 A | | 8/1984 | Miller et al. | |
| 4,729,743 A | | 3/1988 | Farrar et al. | |
| 4,884,171 A | | 11/1989 | Maserang et al. | |
| 5,333,095 A | * | 7/1994 | Stevenson et al. | ........... 361/302 |
| 6,225,876 B1 | | 5/2001 | Akino et al. | |
| 6,456,481 B1 | * | 9/2002 | Stevenson | .................... 361/302 |

OTHER PUBLICATIONS

Spectrum Control Inc., EMI Filters on line catalog Nov. 2004, pp. 1–18 and 61–99.*

Pacific Aerospace and Electronics, EMI/RFI Filters on line catalog Nov. 2004, pp. 1–50.*

Metuchen Capacitors, Inc., Feed–Thru Capacitors, EMI/RFI Suppression Filters, Minature Solder–in Filters on line catalog Nov. 2004, 11 pages.*

Steve Guinta, Analog Dialogue Nov. 2004, Analog Devices, 5 pages.*

American Capacitor Corporation, H series Metallized Polycarbonate Capacitors, Jul. 1997, 3 pages.*

Sprague/Dearborn, Introduction to Feedthrough EMI Filters, catalog Jul. 2000, 1–31.*

Revox Rifa, EMI Suppressors—Properties of Dielectrics, p. 130.

Vishay, X7R Dielectric—Typical Parameters, Jul. 25, 2002, p. 7.

RFI Corp, Tubular Filers, Aug. 14, 2002, p. 1–5, www.rficorp.com/tublars.htm.

* cited by examiner

Primary Examiner—Robert Pascal
Assistant Examiner—Dean Takaoka
(74) Attorney, Agent, or Firm—Maine & Asmus

(57) ABSTRACT

An improved, in-line, bulkhead mounted, electromagnetic interference filter specifically for low frequency, high current applications such as filtering EMI from 400 Hertz aircraft power, consisting in particular of capacitive elements employing a discoidal, non-ferroelectric ceramic dielectric such as NPO/COG, configured in any of the traditional L and C filter arrangements and packaged in a center feed through, ground plane metal jacket suitable for bulkhead or through-hole mounting, offering improved performance over the full specified temperature range, greater reliability and longer useful life than, for example, similar filters employing X7R dielectric.

6 Claims, 3 Drawing Sheets

(1 of 3 Drawing Sheet(s) Filed in Color)

| Current Rating (A) | Voltage Rating @ -55°C to 125°C | | Max L (in) | Min Cap. (μF) | Max R dc (Ω) | Minimum Insertion Loss at +25°C MIL-STD-220 (db) | | | | | | | Filter Electrical Configuration | |
|---|---|---|---|---|---|---|---|---|---|---|---|---|---|---|
| | DC (V) | 400Hz (V) | | | | 30 KHz | 75 KHz | 100 KHz | 150 KHz | 1 MHz | 10 MHz | 1 GHz | | Schematic |
| 10 | 200 | 125 | .35 | .018 | 0.1 | - | - | - | - | 11 | 30 | 66 | C | |
| 10 | 200 | 125 | .50 | .018 | 0.1 | - | - | - | 3 | 17 | 37 | 72 | C | |
| 1 | 200 | 125 | .70 | .018 | 0.5 | 6 | 12 | 17 | 19 | 50 | 90 | 93 | L1 | |
| 2 | 200 | 125 | .71 | .018 | 0.3 | - | 5 | 8 | 11 | 42 | 79 | 96 | L1 | |
| 5 | 200 | 125 | .65 | .018 | 0.1 | - | - | - | - | 32 | 68 | 96 | L1 | |
| 1 | 200 | 125 | .70 | .018 | 0.5 | 6 | 12 | 17 | 19 | 50 | 90 | 93 | L2 | |
| 2 | 200 | 125 | .71 | .018 | 0.3 | - | 5 | 8 | 11 | 42 | 79 | 96 | L2 | |
| 5 | 200 | 125 | .65 | .018 | 0.1 | - | - | - | 3 | 32 | 68 | 96 | L2 | |
| 1 | 200 | 125 | .85 | .035 | 0.4 | 5 | 13 | 17 | 22 | 67 | 98 | 99 | Pi | |
| 2 | 200 | 125 | 1.20 | .070 | 0.4 | - | 8 | 13 | 13 | 71 | 99 | 99 | Pi | |
| 5 | 200 | 125 | 1.20 | .070 | 0.4 | - | - | - | 3 | 55 | 98 | 99 | Pi | |
| 1 | 200 | 125 | 1.10 | .035 | 0.9 | 7 | 27 | 32 | 46 | 93 | 99 | 99 | T | |
| 2 | 200 | 125 | 1.10 | .035 | 0.5 | - | 8 | 20 | 30 | 80 | 99 | 99 | T | |
| 5 | 200 | 125 | .95 | .035 | 0.2 | - | - | - | 8 | 60 | 99 | 99 | T | |
| 1 | 200 | 125 | 1.10 | .035 | 0.9 | 7 | 16 | 30 | 42 | 97 | 99 | 99 | LL1 | |
| 2 | 200 | 125 | 1.50 | .070 | 0.5 | - | 7 | 22 | 35 | 96 | 99 | 99 | LL1 | |
| 5 | 200 | 125 | 1.30 | .070 | 0.2 | - | - | 3 | 8 | 80 | 99 | 99 | LL1 | |
| 1 | 200 | 125 | 1.10 | .035 | 0.9 | 7 | 16 | 30 | 42 | 97 | 99 | 99 | LL2 | |
| 2 | 200 | 125 | 1.50 | .070 | 0.5 | - | 7 | 22 | 35 | 96 | 99 | 99 | LL2 | |
| 5 | 200 | 125 | 1.30 | .070 | 0.2 | - | - | 3 | 8 | 80 | 99 | 99 | LL2 | |

FIG. 3

ELECTROMAGNETIC INTERFERENCE FILTER

This application claims priority for all purposes to pending U.S. application Ser. No. 60/401,855 filed Aug. 7, 2002.

BACKGROUND

1. Technical Field of the Invention

This invention relates to electromagnetic interference filters, and in particular to a bulkhead mounted, center feed EMI filter for low frequency, high current applications, utilizing a non-ferroelectric dielectric material such as NPO/COG.

2. Background Art

Electromagnetic interference (EMI) is created from everyday sources such as lightning, rain and even strong winds. Additionally there are innumerable sources of man made EMI typically created and radiated by televisions, power transmission lines, ignition systems, fluorescent lightning, radar transmissions, electric car chargers, and computing devices. These sources of EMI radiation challenge the equipment, designers and engineers to find a solution to keep electronic signals coming to equipment clean and usable, isolated from the negative effects of the ever present EMI.

EMI filters, electronic devices having suitable capacitive and inductive characteristics for resisting or shorting out the onerous EMI, are commonly installed in electronic circuits to achieve this goal. However, current EMI filters and the practice of using them has several problems including: manufacturing defects in the filters resulting in poor performance; incomplete product specifications leaving users with insufficient information about the filters and how to use them; difficulty in selecting the correct device for the application; and improper installation of the filter for best result in the circuit of interest.

Filters for the application of interest here are commonly fabricated by prior art methods and typically consist of a discoidal capacitor, feed-thru filter in a bulk head mount configuration that is placed in a signal path to shunt any electromagnetic interference in higher frequency ranges to the ground via at least one capacitive component.

Feed-thru filters of this type consist of either a capacitor (C-only) or a combination of capacitive and inductive elements arranged in classic filter configurations (LC, Pi, or T). Each of these capacitors fits a particular application requirement and proper selection is critical. The most economical solution is to select the filter with the fewest internal parts that otherwise achieves the desired filtering effect.

C-only filters, filters that consist solely of capacitive elements, are best suited for filtering high frequency signals on lines with very high impedance. The attenuation of these devices increases in steps of 20 dB per decade from the filter's cutoff frequency up to the frequency where they reach an attenuation of at least 60 dB.

The LC type filter is best suited for applications where there are large differences between line and load impedances. These devices consist of a capacitive element, in the same manner as the C-only filter, with the addition of an inductive element connected in series with the capacitor between the input and output terminals. Usually, it is best to install the filter so that the inductive element faces the lower impedance terminal. With respect to the conventional packaging of discoidal capacitor type filters, this means that in some applications it is desirable to have the capacitive element close to the threaded or screw-neck header end of the filter package, while in other cases the reverse is desirable, with the inductive element located on the threaded or screw-neck end.

Unlike conventional leaded capacitors, the discoidal capacitor's co-axial configuration provides two unique advantages. It prevents radiation present at the input end from coupling directly to the capacitor output. This construction also has inherently low self-inductance and the combination provides excellent shunting of EMI at frequencies approaching 1 GHz. The addition of inductive elements (wire wound coils, toroids or beads) in series with the capacitor increases the impedance of the line, making the filter even more effective.

Pi filters consist of three elements. A series inductive element is positioned between two capacitors which are shunt connected to the electrical ground plane. Pi filters are best suited for applications where the input and the output impedances are of similar value and high levels of attenuation are required. These filters typically increase attenuation by 60 dB per decade from the filter cutoff frequency to the frequency where the filter exhibits an attenuation of at least 80 dB.

The T filter is also a three-element device, but this time there are two series inductors connected between the input and output terminals on each side of a single capacitor which is shunt connected to the ground plane. They perform in much the same manner as a Pi filter, increasing attenuation in steps of 60 dB per decade from the cutoff frequency to the frequency where the attenuation is at least 60 dB. This filter type is selected when both the input and output impedances are low.

Internally the most complicated device, the LL filter consists of two feed through capacitors connected between line and ground interspersed with two inductors connected in series between the input and output terminals. These filters increase in attenuation in steps of 80 dB per decade from the cutoff frequency to the frequency where the attenuation is at least 80 dB.

Today, most center through-feed, metal housing, bulkhead or through hole mounted, EMI filters for low frequency, high current applications employ at least one discoidal capacitor element, and commonly use X7R ceramic formulations for the capacitor dielectric. It is cost effective and has an adequate dielectric constant at normal operating temperatures. However, this ferroelectric material has certain inherit disadvantages. Over time this dielectric will experience capacitance loss due to intercrystalline aging. This capacitance loss occurs logarithmically when temperatures go below the Curie point of the formulation. The applied voltage, AC or DC, also affects capacitance when the voltage level is low compared to the rated voltage of the device. When this happens, a polarizing effect takes place that can drop the capacitance value of the device by as much as fifty percent of the original value. The X7R dielectric also exhibits a relatively large change in capacitance with operating temperature. The capacitance drops as much as 10% from the original value at high end, +85 C., and low end, −55 C., temperatures.

Another undesirable attribute of the X7R dielectric, particularly in AC applications, is its loss characteristics or dissipation factor. The dissipation factor loss tangent is the quotient of the active and reactive components of the impedance. DF is the measurement of dielectric losses and is dependent on temperature and frequency. Dielectric loss is the result of the changing polarization of the dielectric caused by alternating fields. They are transformed into oscillations and thus produce frictional heat. Typically the DF is as high as 0.02 absolute at 1 kHz to over 0.04 absolute at 100 kHz, at +25 C. This loss characteristic is directly related to the self-generated heat rise inside the device during AC operation. This heat rise must be added to the ambient operating temperature to have an accurate indication of the filter's actual temperature during operation. In this case, the EMI filter may be running at +160 C. internal temperature when it is believed to be operating at +125 C.

The above situation causes serious problems since it places stresses on the dielectric that may not have been expected or understood by the equipment designer. The first of these is mechanical stress. In the winter or at high altitude or relatively cooler environmental temperatures, the differences in the thermal coefficients of expansion between the ceramic capacitor, the metal housing and the center conductor will be understood to be quite large. This puts unnecessary stresses on the fragile ceramic layers than can lead to cracking and delamination. The breakdown strength of the dielectric layers is also affected by temperature and will in time lead to a premature failure of the device in the form of an electric short. Unfortunately, this root cause of failure, cracks in the ceramic dielectric layers, is frequently misdiagnosed during failure analysis.

Improper soldering of filter leads is also a problem that often occurs with feed-thru filters. A soldering iron held too long during installation may cause the ceramic capacitor to develop microcracks in the dielectric layers since heat is conducted down the center conductor to the ceramic capacitor. Over time these tiny cracks develop debris and contaminants and in conjunction with the applied electric field, develop conductive paths leading to ever increasing leakage current until an electrical shortage occurs. Also the center conductor of the ceramic capacitor may actually be unsoldered, removing the capacitor from the filter circuit completely, which will drastically affect the desired attenuation of the filter.

Other commercially available impedance devices, typically surface mounted and used for lower current applications, include chip and miniature discoidal capacitors, which are known to be available with different dielectrics. Multi-Layer Chip Capacitors (MLCC), and miniature discoidal capacitors, for example, may use any of NPO/COG, X7R and Y5V dielectrics. The choice of dielectric material is usually determined by the required capacitance-temperature stability. Class I capacitors or temperature compensating capacitors have predictable temperature coefficients and in general do not have an aging characteristic.

The most popular class 1 multi-layer ceramic chip capacitors are COG (NPO) temperature compensating capacitors. EIA class 2 capacitors typically are based on the chemistry of barium titanate and provide a wide range of capacitance values and temperature stability. The most commonly used class 2 dielectrics are X7R and Y5V. MLCC class 1 NPO/COG dielectric capacitors are typically used in such applications as coupling, LC networks, high frequency EMI, band pass, lowpass filter, cellular phone, high frequency amplifier, thin film, thick film, hybrid circuits and modules, LTCC, Blue tooth circuit board, Cordless Phone, Wireless LAN, PDA, and RF modules. However, the applicant is not aware of any low frequency, high current, center feed, metal packaged EMI filters for bulkhead or through hole mounting that utilize a NPO/COG or equivalent material for the discoidal capacitor dielectric elements.

It is clear that an improved, electromagnetic interference filter of the discoidal capacitor, center feed-through type, configured in a metal package for bulkhead or through-hole mounting, expressly for low frequency, high current applications in the range of DC to 3000 hertz and up to 40 amperes current, and further up to 100 KHertz at lower current values, that can overcome the mechanical and thermodynamic stresses that occur in common bulkhead installations and maintain a relatively uniform degree of performance over a temperature range of −55 to +125 C. with extended life expectancy, would be useful.

SUMMARY OF THE INVENTION

It is an object of the invention to provide a center feed-through, EMI filter in a ground plane package for bulkhead or through-hole mounting, for low frequency, high current filtering applications, with improved mechanical stability in a rugged environment and wide temperature range.

It is a further object to provide such an EMI filter comprised of a ceramic dielectric formulation with improved resistance to an intercrystalline aging process.

It is another object of the invention to provide such a filter with a substantially constant capacitance regardless of voltage applied.

It is an additional object of the invention to provide such a filter with a dissipation factor that is much lower that the dissipation factor of existing bulkhead filters such as filters using an X7R dielectric material.

To this end, the Applicant has divined, developed and extensively tested the use of NPO/COG as a dielectric in a bulkhead mount filter package of efficient size for low frequency, high current applications such as aircraft power filtering, an art not enjoying much development effort in recent years, with unexpectedly good results.

Other objects and advantages of the present invention will become readily apparent to those skilled in the art from the following detailed description, wherein we have shown and described only a preferred embodiment of the invention, simply by way of illustration of the best mode contemplated by us on carrying out our invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 3 is a chart illustrating the specifications and schematic of several embodiments of the invention.

DESCRIPTION OF THE PREFERRED EMBODIMENT

The invention is susceptible of many embodiments. The preferred embodiment of the present invention is a center conductor feed through, metal packaged, bulkhead or through-hole mounted, EMI filter with a discoidal capacitor element using non-ferroelectric ceramic materials as its capacitor dielectric, for filtering 400 hertz AC line power with up to 40 amperes of current draw. However, the invention extends to filtering AC power lines and other relatively high current, 1 ampere and higher, low frequency power or signal lines or sources in the range of DC to 3000 hertz and higher, at rated voltages of up to 270 VAC and 200 VDC.

The preferred embodiment employs NPO/COG dielectrics or equivalent materials, resulting in a larger filter size compared to the equivalent prior art X7R dielectric devices. Use of an NPO/COG dielectric material for the capacitive elements of the device for this type filter and application was not previously considered in the prior art, probably due to its higher cost, lower dielectric constant, and predictably larger package size. However, this applicant's insight, engineering, and extensive testing has revealed significant advantages to using a non-ferroelectric material like NPO/COG in this application; advantages not readily apparent in the differences in the basic dielectric material specifications. Not withstanding a slight penalty in package size, the preferred embodiment exhibits the following beneficial characteristics that overcome problems described in the prior art:

1. The filters do not exhibit the typical time dependence of a dielectric constant, and the associated loss in capacitance from intercrystalline aging.
2. The filters have a substantially constant capacitance regardless of the applied voltage.
3. The filters experience substantially no change in capacitance with temperature.
4. The filters have a dissipation factor that is much lower, as much as 20 times lower, than that of filters using the X7R dielectrics.

Figure 1A:
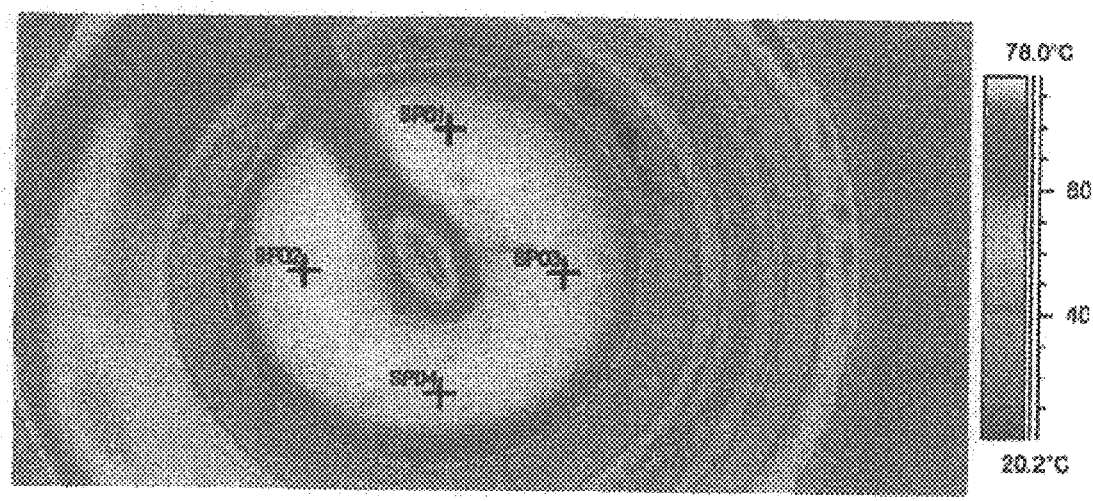
FIGS. 1A and 1B are color thermographic representations illustrating the difference in internally-generated heat at the ceramic face of two capacitors using ferroelectric and non-ferroelectric dielectric materials respectively, operating at the same AC voltage and ambient temperature conditions.
Figure 1B:
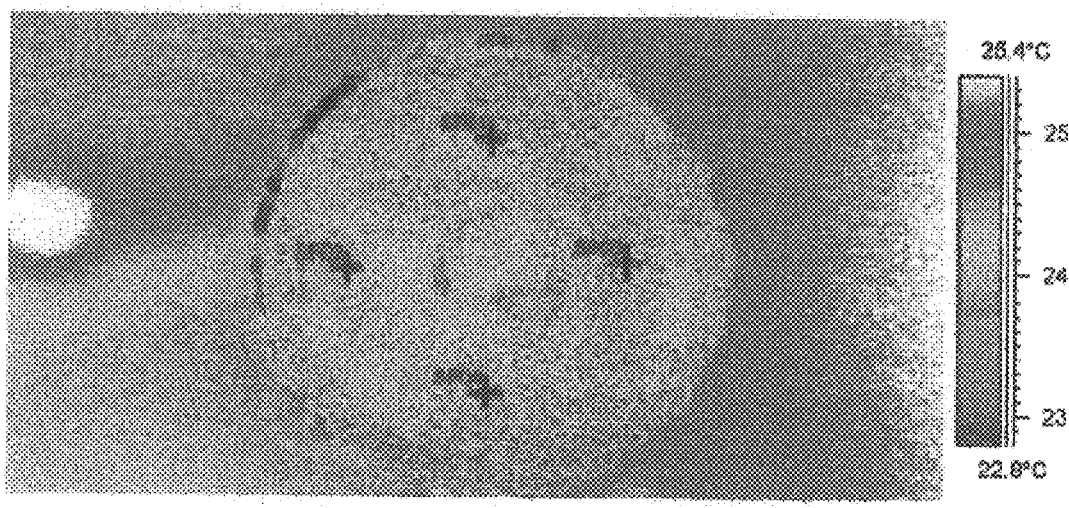

Referring to FIGS. 1A and 1B, a thermographic color representation was taken comparing the heat rise in a conventional filter, prior art FIG. 1A, using the X7R dielectric to a FIG. 1B device of the invention having NPO/COG as the dielectric material. Both devices of FIGS. 1A and 1B were operating in a +25 C. temperature environment with a 400 Hertz signal applied at 125 volts rms. Four targets distributed about the center point of each of the FIGS. 1A and 1B indicate the equivalent points within the disk area of the ceramic face on each figure, and indicate the respect levels of heat generated. In prior art FIG. 1A, the color representation in the vicinity of the targets indicates an approximate temperature of over +75 C. on the ceramic face. In FIG. 1B, the color representation in the vicinity of the targets indicates an approximate temperature of about +24C. on the ceramic face.

As is apparent from the associated color bars and calibrated temperature scales to the right of each photo, the filter of the invention, FIG. 1B, indicated little or no temperature rise across the face of the dielectric disk, while the prior art device of FIG. 1A reached temperatures approximately 50 degrees Centigrade higher than the ambient operating environment. It can be logically concluded from this evidence that the non-ferroelectric dielectric of the claimed device is not being subjected to the same degree of thermally induced mechanical stresses as the prior art device, nor is it being subjected to the voltage stresses that normally occur at temperatures significantly exceeding the ambient environment.

The actual result, verified by extensive testing, is a center feed-through, EMI filter with longer life expectancy and greater reliability when packaged and installed in the same manner, and operated in the same low frequency, high current applications and environments as the prior art device. The new filter can be provided in all of the common filter configurations, C, LC, T, and Pi, and in the same housing types as the prior art EMI filters it replaces.

It should be noted that the invention extends to a center feed-through, bulkhead or other through-hole mounting EMI filter using a non-ferroelectric dielectric material, having equivalent or better capacitance versus temperature, and equivalent or lower dissipation factor and AC heat rise characteristics as the NPO/COG material of the preferred embodiment.

Figures 2A, 2B:
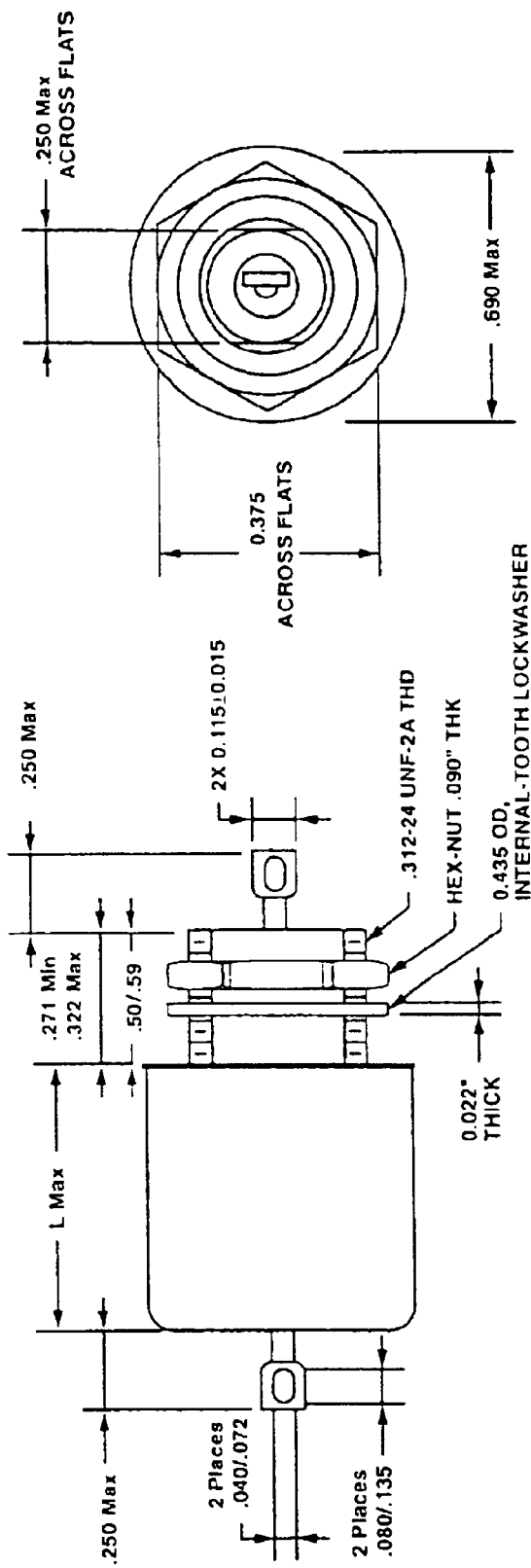
FIGS. 2A and 2B are side and end views of a preferred embodiment device of the invention.

FIGS. 2A and 2B illustrate the package size and configuration of the several preferred embodiments described in FIG. 3. The dimensions show are in inches. The embodiments of FIG. 3 have been commercialized and are enjoying a strong endorsement by users who had prior experience with X7R filters.

According to the preferred embodiment and best practices, the filter should be mounted as close as possible to the point of the power line's egress from the device being filtered. The ground plane housing should be mechanically and electrically secured to the bulkhead, shield, or mounting structure for structural and functional integrity. The filter's input and output leads should be physically separated to provide the greatest amount of electrical isolation possible. At any point of penetration through the device's electrical shield, the shield's continuity should be maintained. In addition, production operators should be trained to solder in accordance with best industry practice, such as to the IPC/EIA J-STD-001C Joint Industry Standard which is well known in the industry. Those skilled in the art will appreciate, for example, that a hotter soldering iron for as short a time as possible, rather than a cooler iron applied for a longer period, is preferred. Additionally, the solder alloy used during installation of the filter can not have a higher melting point than the solder used to seal the filter, usually a 60% tin and 40% lead solder alloy should be used during installation.

Additional manufacturing steps according to the preferred embodiment and best practice techniques include applying minimal torque over the threaded screw neck holder when installing feed-thru filters. If too much torque is applied when the mounting hardware is installed it may actually twist the internal components of the filter by torsional stresses applied down through the center conductor. This potential problem is overcome by the method of providing production operators with a torque wrench for the installation.

Additionally, according to the preferred embodiment and best practice techniques, the terminals on a filter should never be bent. This can transmit the same type of forces down the center conductor as applying too much torque to the threaded or screw neck header. If a special orientation of the terminals is desired, the filters should be ordered from the manufacturer in that configuration.

Other and various embodiments of the invention are within the scope of the appended claims. For example, there is an improved, in-line EMI filter for direct and low frequency alternating current applications consisting of a ground plane housing suitable for bulkhead and through-hole mounting, with center feed terminations on each end. It may have at least one discoidal capacitor element configured with a non-ferroelectric ceramic dielectric such as NPO/COG or equivalent. It may have a current rating in the range of at least 1 and up to 40 or more amperes. It may have a VDC rating of up to 200 volts, a VAC voltage rating of up to 270 volts at a frequency of up to 3000 Hertz and higher, while preferred embodiments have a rating of 125 VAC at 400 Hertz and 200 VDC or steady state component of voltage as it is commonly understood.

The device may have a dissipation factor of not more than 0.1% at 1000 Hertz applied power. It may have a capacitance change versus temperature characteristic of less than 1% over the full working temperature range, a preferred embodiment range being −55 to +125 Centigrade. It may have an internally generated heat rise characteristic at 400 hertz and 125 VAC in a +125 operating environment of less than 10 degrees Centigrade. And the housing may have a maximum diameter of not more than 1.0 inches, and preferably not more than 0.7 inches.

Other various and equivalent embodiments and examples will be apparent to those skilled in the art from the description, figures, and appended claims.

I claim:

1. An improved, in-line EMI filter for direct and low frequency alternating current applications comprising:
    a ground plane housing of not more than 0.7 inches diameter suitable for bulkhead and through-hole mounting with center feed terminations on each end thereof,
    at least one discoidal capacitor element configured with a NPO/COG dielectric,
    a current rating of at least 1 ampere,
    a voltage rating of at least 125 VAC at 400 Hertz and 200 VDC,
    a dissipation factor of less than 0.1 with an applied voltage of 125 VAC at 400 Hertz,
    a capacitance change versus temperature characteristic of less than 1% over a temperature range of −55 to +125 Centigrade, and
    an internally generated heat rise characteristic at 400 hertz and 125 VAC in a +125 operating environment of less than 10 degrees Centigrade.

2. An improved, in-line EMI filter according to claim 1, configured internally as a C-only filter.

3. An improved, in-line EMI filter according to claim 1, configured internally as an LC filter.

4. An improved, in-line EMI filter according to claim 1, configured internally as a Pi filter.

5. An improved, in-line EMI filter according to claim 1, configured internally as a T filter.

6. An improved, in-line EMI filter according to claim 1, configured internally as an LL filter.

* * * * *